United States Patent [19]

Bertin et al.

[11] Patent Number: 5,567,653
[45] Date of Patent: Oct. 22, 1996

[54] PROCESS FOR ALIGNING ETCH MASKS ON AN INTEGRATED CIRCUIT SURFACE USING ELECTROMAGNETIC ENERGY

[75] Inventors: Claude L. Bertin, South Burlington; John E. Cronin, Milton, both of Vt.; David J. Perlman, Wappingers Falls, N.Y.

[73] Assignee: International Business Machines Corporation, Armonk, N.Y.

[21] Appl. No.: 306,042

[22] Filed: Sep. 14, 1994

[51] Int. Cl.⁶ .......................... H01L 21/027; H01L 21/31
[52] U.S. Cl. .......................... 437/173; 437/208; 437/229; 430/327
[58] Field of Search .................. 437/208, 915, 437/974, 229, 984, 173, 228 M, 228 MRK, 924; 430/313, 327; 257/777, 797

[56] References Cited

U.S. PATENT DOCUMENTS

| | | | |
|---|---|---|---|
| 4,704,319 | 11/1987 | Belanger et al. | 428/209 |
| 4,706,166 | 11/1987 | Go | 361/403 |
| 4,754,316 | 6/1988 | Reid | 357/68 |
| 4,764,846 | 8/1988 | Go | 361/388 |
| 4,949,148 | 8/1990 | Bartelink | 357/74 |
| 4,999,311 | 3/1991 | Dzarnoski, Jr. et al. | 437/51 |
| 5,086,018 | 2/1992 | Conru et al. | 437/207 |
| 5,107,586 | 4/1992 | Eichelberger et al. | 29/830 |
| 5,121,299 | 6/1992 | Frankeny et al. | 361/413 |
| 5,126,286 | 6/1992 | Chance | 437/203 |
| 5,266,833 | 11/1993 | Capps | 257/690 |
| 5,279,991 | 1/1994 | Minahan et al. | 437/208 |
| 5,356,838 | 10/1994 | Kim | 437/226 |
| 5,381,047 | 1/1995 | Kanno | 257/777 |
| 5,394,010 | 2/1995 | Tazawa et al. | 257/686 |

FOREIGN PATENT DOCUMENTS

| | | |
|---|---|---|
| 0090661 | 5/1983 | European Pat. Off. |
| 6352462 | of 1988 | Japan. |
| 2239651 | of 1990 | Japan. |

OTHER PUBLICATIONS

"Infrared Alignment Fixture for Chip Writer System," *IBM Techincal Disclosure Bulletin*, vol. 30, No. 5, 87–90, Oct. 1987.

*Primary Examiner*—George Fourson
*Assistant Examiner*—David E. Graybill
*Attorney, Agent, or Firm*—Heslin & Rothenberg, P.C.

[57] ABSTRACT

Methods for alignment of stacked integrated circuit chips and the resultant three-dimensional semiconductor structures. A thickness control layer is deposited, as needed, on each integrated circuit chip. The thickness of the layer is determined by the thickness of the chip following a grind stage in the fabrication process. Complementary patterns are etched into the thickness control layer of each chip and into adjacent chips. Upon stacking the chips in a three dimensional structure, precise alignment is obtained for interconnect pads which are disposed on the edges of each integrated circuit chip. Dense bus and I/O networks can be thereby supported on a face of the resultant three-dimensional structure.

11 Claims, 7 Drawing Sheets

PROCESS FOR ALIGNING ETCH MASKS ON AN INTEGRATED CIRCUIT SURFACE USING ELECTROMAGNETIC ENERGY

TECHNICAL FIELD

The present invention relates in general to semiconductor structures and fabrication methods therefor. More particularly, the present invention relates to methods for aligning individual integrated circuit chips in a three-dimensional semiconductor structure.

BACKGROUND OF THE INVENTION

As the need for greater processing capability in semiconductor devices increases, new methods for increasing performance of such devices have developed. One method involves merely increasing the device density on individual integrated circuit chips. Another involves arranging multiple integrated circuit chips on a planar surface, such as a printed circuit board. Recently, three-dimensional "stacking" has been proposed as a method for increasing the density and capability of semiconductor devices. Integrated circuit or chip "stacking" can be performed by grinding chip thickness to smaller dimensions (e.g., 100 μm) and laminating multiple chips together into an electronic module or cube, as shown in FIG. 1.

One consequence of chip stacking is that unique wiring problems exist. Connection pads for each chip must be placed on the edge of the chip for electrical connections either to external devices or adjacent chips. FIG. 1 illustrates such an arrangement. Cube 10 consists of multiple, stacked integrated circuit chips 14. Bus and I/O network 12 can be arranged on a cube face with electrically conducting pads, e.g., 22a–22c providing the connection between interior chip devices and the bus and I/O network. For example, line 16 commonly connects a row of underlying pads. To connect interior chip devices, chip 14 employs metallization line 20 which is routed from the interior devices. The exposed edge of line 20 becomes pad 18 which provides a connection, through the bus and I/O network 12, to external devices or adjacent chips.

The pads are of necessarily small dimensions because they may be merely the exposed edge of a metallization line, and may be further constrained in size by the small chip edge on which they are mounted. Because of the small dimensions of such pads, unique alignment problems exist when placing a bus and I/O network over the pads. Specifically, lateral alignment and longitudinal spacing between pads on different chips must be controlled to enable the accurate placement of a bus and I/O network over the pads. In addition, requirements currently exist for very dense bus and I/O networks. The alignment and spacing of the pads will necessarily impact the accurate formation of dense bus and I/O networks.

FIG. 2 depicts an example of a bus and I/O network on a face of a module. Lateral alignment of pads 32a and 36a with pads 32b and 36b is required for line connections 30 and 34 which commonly connect all chips. In addition, some connections only require lines between pads on selected chips. For example, lines 38 and 42 require connections between pads 40a and 40b, and pads 44a and 44b, respectively. In such instances, longitudinal spacing between the pads must be accurately controlled to permit an accurate contact at, for instance, pad 44a.

Presently, lateral alignment between chips is performed by physically aligning the chip edges. The effectiveness of this physical alignment is impacted by (1) where the edge of each chip is defined which is created by the positioning of a mechanically aligned saw blade (used to dice the chips), and (2) the physical alignment mechanism that aligns one chip to another. Large line widths are often used to compensate for the large errors associated with physical alignment techniques. The alignment between pads chip-to-chip is therefore impacted by the positioning of a saw blade (and the associated large line widths used) and the variations in the physical alignment mechanism. Present capabilities offer saw blade tolerances of ±25 μm and variances of ±7½ μm. Pad alignment chip-to-chip must take this into account as well as the variation of the physical alignment which is ±15 μm.

Presently, control of longitudinal distances between each chip (and thus distances between pads on selected chips) is entirely dependent on the thickness of each chip. This thickness is determined during a grind stage in the fabrication process. For example, a physical reference is used to control a wafer grinder. The resultant thickness of a ground wafer cannot presently be adequately controlled with a physical reference to support the required wiring densities, as discussed above. Also, the glue layer required to laminate one chip to another can vary in its final thickness. Distances between stacked chips, and therefore between pads mounted thereon, will vary and impact the implementation of a dense bus and I/O network. This variance, using present technology, can be 20–30 μm.

In U.S. Pat. No. 5,121,299 entitled "MULTILEVEL CIRCUIT STRUCTURE UTILIZING CONDUCTIVE CORES HAVING CONDUCTIVE PROTRUSIONS AND CAVITIES THEREIN," and assigned to the same assignee as the present invention, a technique is disclosed which provides precise registration (or lateral alignment) so that interconnections which are drilled through multiple layers will intersect at precise points. A system of protrusions and depressions is disclosed which provides the precise alignment, or registration. The protrusions and depressions are etched directly into the substrate. Etching the protrusions directly into the substrate requires a proportionately thicker substrate which in turn results in decreased electrical performance due to stray capacitances. In addition, there is no technique disclosed for precisely controlling the longitudinal distances between layers.

A need therefore exists for improved fabrication methods and resultant structures which will support cube arrangements, including dense bus and I/O networks placed thereon. Physical alignment through edge alignment or grinder control should be avoided. The resultant pad placement should be approximately as accurate as device placement within each chip, i.e., tolerances below 20 μm. The alignment technique should also be independent of the thickness of the substrate thereby maintaining adequate electronic performance levels.

SUMMARY OF THE INVENTION

The shortcomings of the prior art are overcome by the provision of a method for controlling a distance between two integrated circuits in a three-dimensional electronic module having a plurality of stacked integrated circuit chips. The method includes determining a first thickness of one of two integrated circuit chips and forming a layer on the integrated circuit chip. The layer has a thickness determined from the first determined thickness and a desired thickness such that upon stacking the two integrated circuit chips in the three-dimensional electronic module, a distance between the two integrated circuit chips is controlled by the layer.

In another aspect of the invention, the method includes etching a pattern into the layer, the pattern having at least one recessed region of a predetermined depth, and etching a complementary pattern in another one of the two integrated circuit chips such that upon stacking the two integrated circuit chips in the three-dimensional electronic module, the pattern and the complementary pattern interlock thereby laterally aligning the two integrated circuit chips.

In another aspect of the invention, electrically conducting pads are provided at positions on an edge of one of the two integrated circuit chips and corresponding electrically conducting pads are provided at corresponding positions on an edge of the second one of the two integrated circuit chips such that the electrically conducting pads and the corresponding electrically conducting pads are laterally aligned and a distance between the pads is controlled upon stacking the two integrated circuit chips in the three-dimensional electronic module.

In another aspect of the invention, an electronic module is provided which includes two integrated circuit chips having different thicknesses and front and back surfaces. The two integrated circuit chips are stacked in the electronic module. A first thickness control layer is disposed between the two integrated circuit chips such that a distance between the two integrated circuit chips is controlled by the thickness control layer.

In another aspect of the invention, the electronic module includes a third integrated circuit chip such that three integrated circuit chips are stacked in the electronic module. A second thickness control layer is provided and disposed between the second and third integrated circuit chips such that a distance measured between the front surfaces of any two of the three integrated circuit chips is substantially a multiple of the distance measured between the front surfaces of two adjacent integrated circuit chips in the electronic module.

In another aspect of the invention, a method for aligning a pattern formed on a first surface of an integrated circuit chip with a complementary pattern formed on a second surface of the integrated circuit chip is provided. The method includes etching a pattern into the first surface according to a first mask aligned to devices below the first surface. The pattern has regions of different heights. The method additionally includes irradiating the first surface with penetrating electromagnetic energy and aligning a second mask over the second surface to the pattern by detecting portions of the penetrating electromagnetic energy above the second surface. The method further includes etching a complementary pattern into the second surface according to the second mask. The complementary pattern has regions of different heights. The method further includes repeating all of the above steps for each of a plurality of integrated circuit chips such that upon stacking the plurality of integrated circuit chips, the patterns and complementary patterns of adjacent ones of said plurality of integrated circuit chips will interlock. The method further includes etching the patterns and complementary patterns into thickness control layers disposed on the first or second surfaces.

The methods and structures disclosed herein overcome the shortcomings of the prior art by allowing precise lateral alignment between stacked integrated circuit chips and precise control of longitudinal distances between the stacked integrated circuit chips. The precise alignment and control in turn allows dense bus and I/O networks to be formed on a face of the electronic module and contact electrically conductive pads which are provided on the exposed edges of selected ones of the stacked integrated circuit chips.

BRIEF DESCRIPTION OF DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of a preferred embodiment and the accompanying drawings in which:

DETAILED DESCRIPTION

Broadly stated, the present invention provides alignment methods and resulting stacked and aligned three-dimensional semiconductor structures. As discussed above, current alignment techniques suffer from the dimensional tolerances of physical manipulations including wafer grinding and edge alignment. The present invention provides alignment techniques which are employed at the "mask" level and therefore support the "VLSI" dimensional tolerances required for dense bus and I/O networks placed on a side face of an electronic module formed from multiple stacked integrated circuit chips.

Both lateral alignment and thickness (or distance) control are provided in an embodiment of the present invention. Thickness control is accomplished by the provision of at least one thickness control layer between stacked chips. The layer is deposited and/or etched to a precise thickness which compensates for thickness errors in the wafer grinding stage. In addition, complementary, interlocking patterns, e.g., projection and recess structures, can be etched into chips and/or thickness control layers to provide accurate lateral alignment. Also provided are novel alignment methods for providing aligned complementary patterns on multiple chips.

Figure 3:
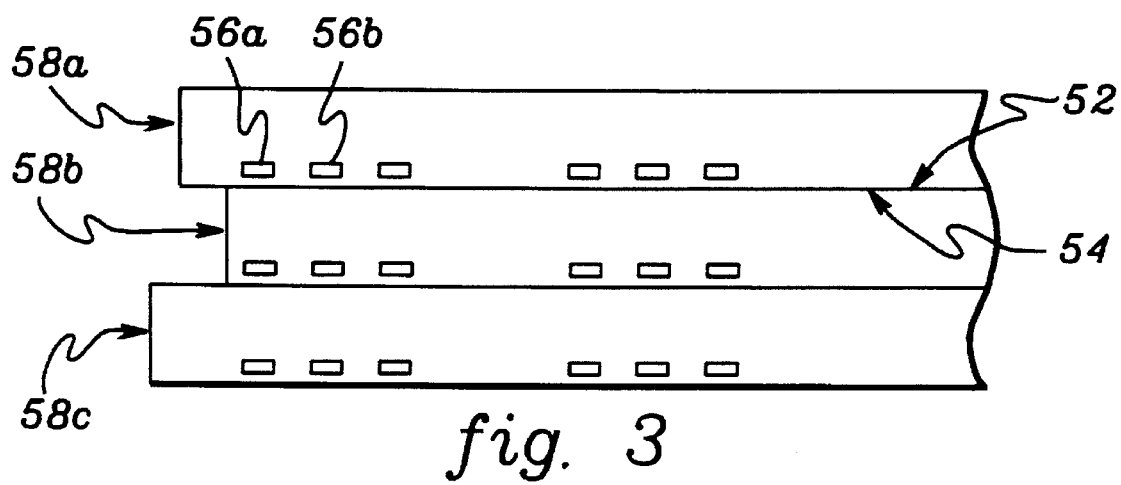
FIG. 3 illustrates a stack of integrated circuit chips in which the pads are properly aligned and which employs front-to-back mounting.
Figure 4:
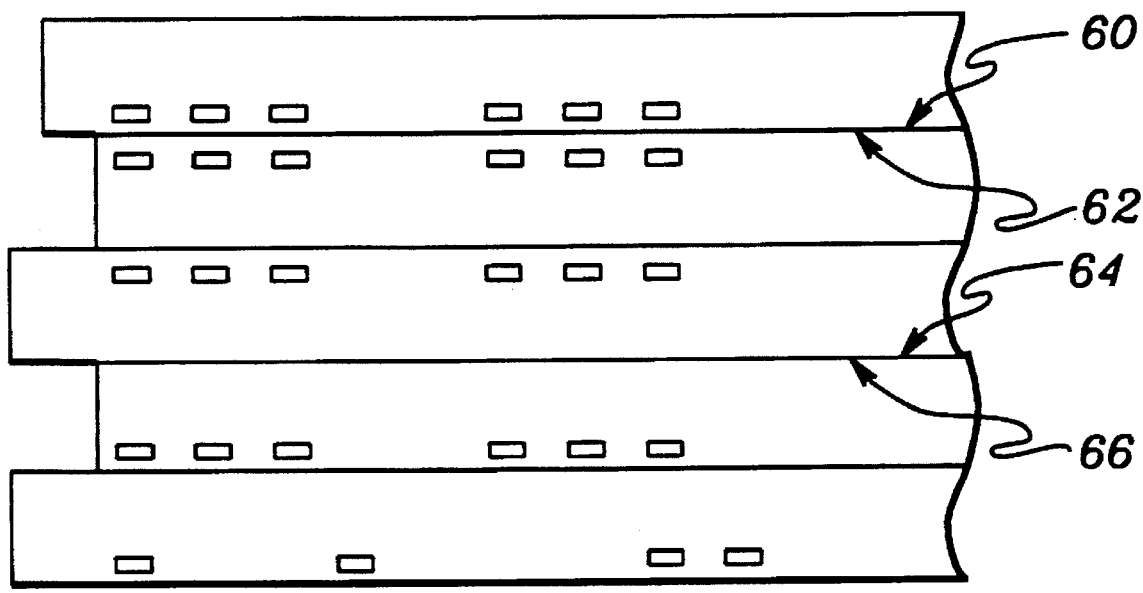
FIG. 4 illustrates a stack of integrated circuit chips in which the pads are properly aligned and which employs varied mounting techniques.

FIGS. 3 and 4 illustrate that if lateral alignment is referenced to the pads instead of the chip edges, much tighter wiring pitches are possible. FIG. 3 depicts pads 56a and 56b, which are aligned with pads on adjacent chips. Chip edges 58a–c are not employed for alignment and thus may be misaligned, as shown. Note that a front surface 52 to back surface 54 mounting technique is employed. The line/wiring channels are now fully restored at tighter ground rules. Grinding the sides of the cube can be employed to produce a planar surface. The silicon removed will contain kerf devices and will not impact the product. Note that the chips can be mounted front 60 to front 62, back 64 to back 66, etc. as shown in FIG. 4, and each chip can be formed from either semiconductor or non-semiconductor material.

Figure 1:
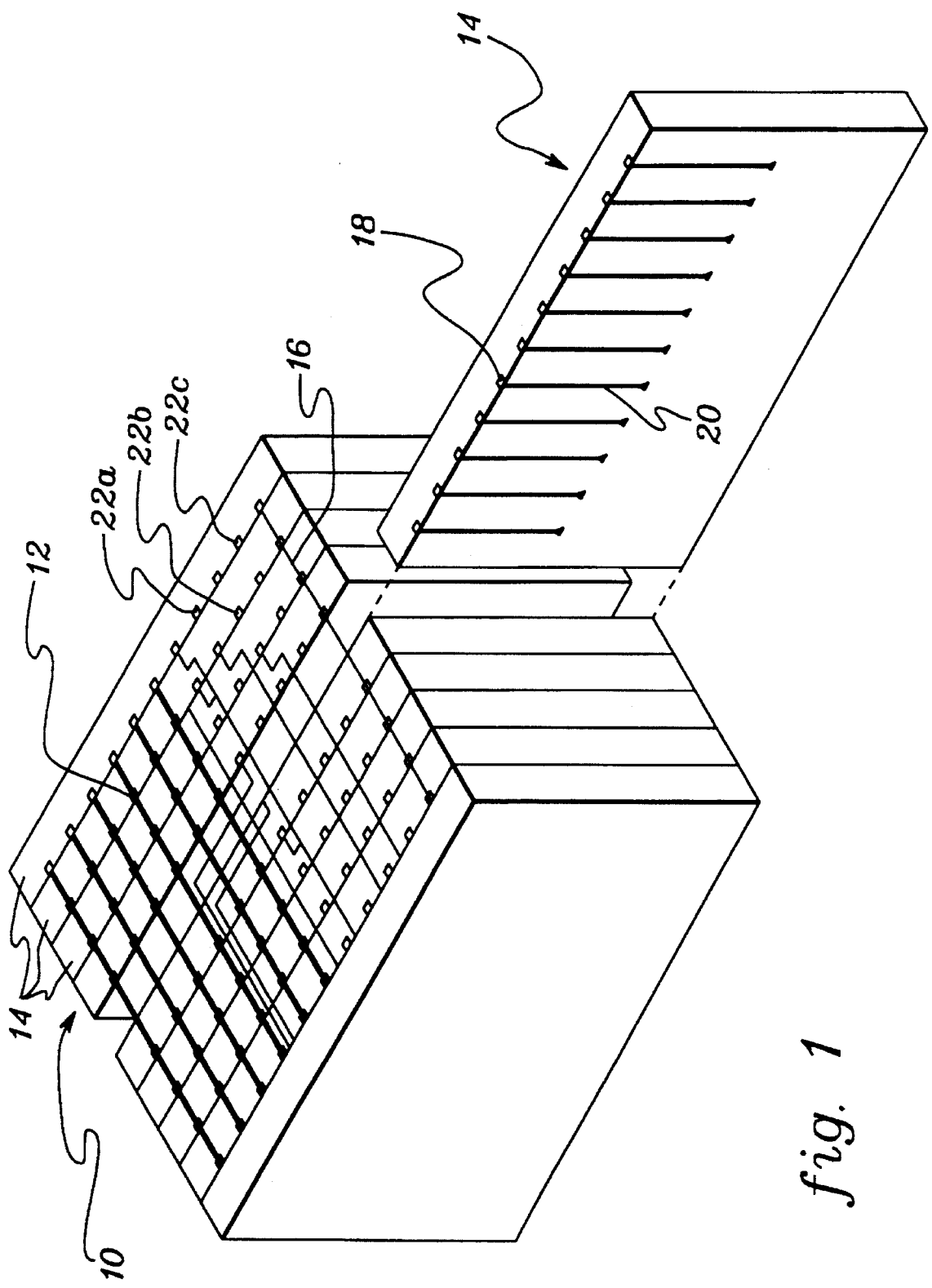
FIG. 1 illustrates an example of a three-dimensional electronic module formed from stacked integrated circuit chips and having a bus and I/O network disposed on a surface thereof.
Figure 2:
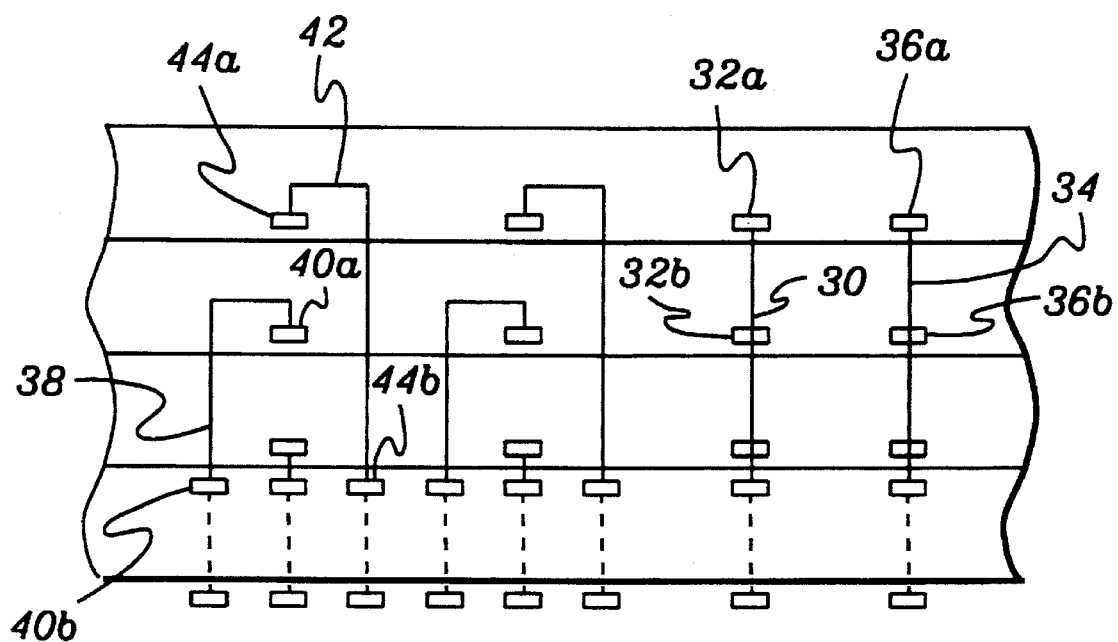
FIG. 2 illustrates a sample bus and I/O network having connections to pads disposed on the edges of each stacked integrated circuit chip.
Figure 5:
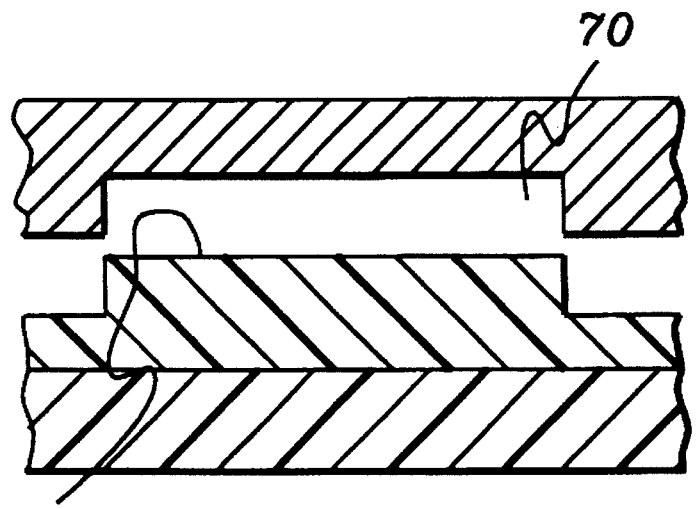
FIG. 5 illustrates a lateral alignment technique pursuant to the principles of the present invention.

FIG. 5 illustrates one way of achieving the improved alignment. Reference projections 72 on one surface (e.g., front) mate with recesses 70 etched in the back of the silicon chip (either on the substrate itself or in a layer). The projections and recesses are aligned to the devices or pads of each chip. The alignment of the patterns requires IR radiation from the front or back of the wafer and is discussed further below. With such chip-to-chip alignment aids during stacking, the wiring density can be enhanced by 4×, which maximizes the wireability of the side face bus and I/O network 12 of a cube as shown in FIG. 1. One skilled in the art will recognize that a variety of such complementary patterns are possible, including pegs, grooves, dimples, holes, etc., and that alignment in one or both lateral directions is possible.

Figure 6:
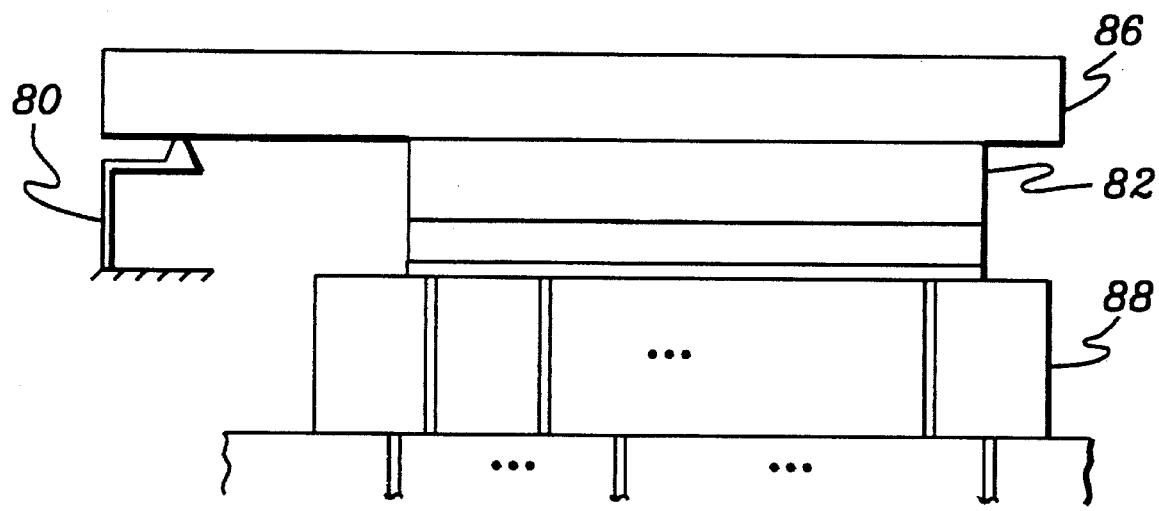
FIG. 6 illustrates a technique employed to grind wafers to a desired thickness.
Figure 7:
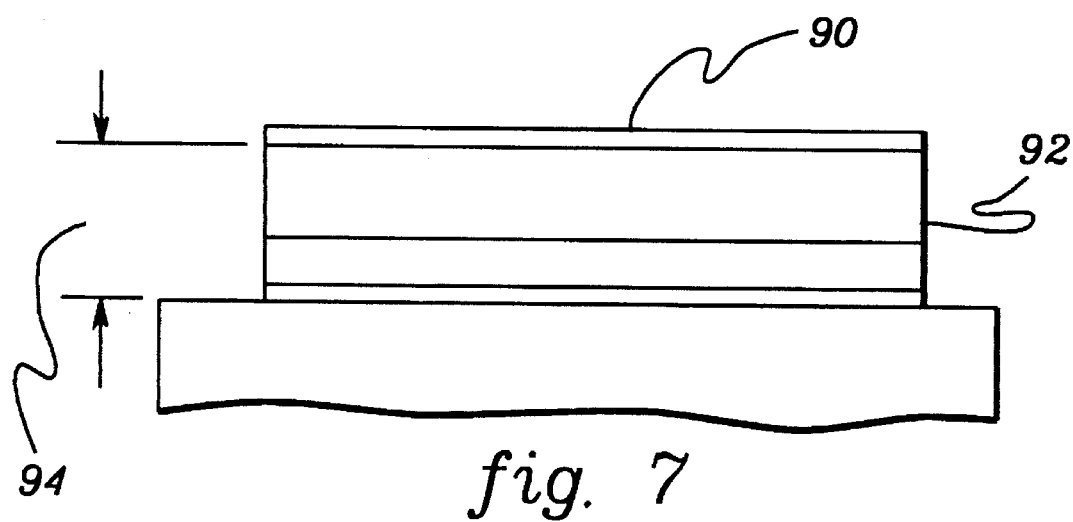
FIG. 7 illustrates the deposition of a thickness control layer on a previously ground wafer pursuant to the principles of the present invention.

The distance between chips and the lateral alignment of chips must both be simultaneously satisfied to support dense bus and I/O networks as discussed above. It is desirous therefore to obtain thickness, or distance control of the chips such that it approximately matches the precision of the pad lateral periodicity. FIG. 6 shows a wafer 82 ground to a fixed reference 80 by grinder 86, and a wafer holder 88 of a known thickness. As discussed above, this reference does not provide an adequate tolerance. FIG. 7 shows a ground wafer 92 whose final thickness 94 is accurately measured using a laser ruler, for example.

Pursuant to an embodiment of the present invention, a thickness control layer 90 can be deposited, or deposited and etched, with adequate thickness control such that the final total dimensions of the chip are controlled to within ±2½ μm. This is a vast improvement over the grinding technique discussed above.

If the layer added to the wafer is also silicon, then the thermal coefficient of expansion ("TCE") perpendicular to the silicon chip is the same as TCE for Si. A different layer can be chosen for a different TCE than that of silicon. The layers can also comprise a thermic adhesive used to fasten the chips together in the cube. Other layer materials are possible including EPI deposit, polyamide deposit, silicon. A material having the same or different expansivity as silicon may be used. The layer can be electrically conducting or nonconducting, and thermally conducting or nonconducting. One etch process includes employing photoresist masks and $CF_4$ in $O_2$ in a reactive ion etching mode. Those skilled in the art will recognize that many deposition and etch techniques are available.

Figure 8A:
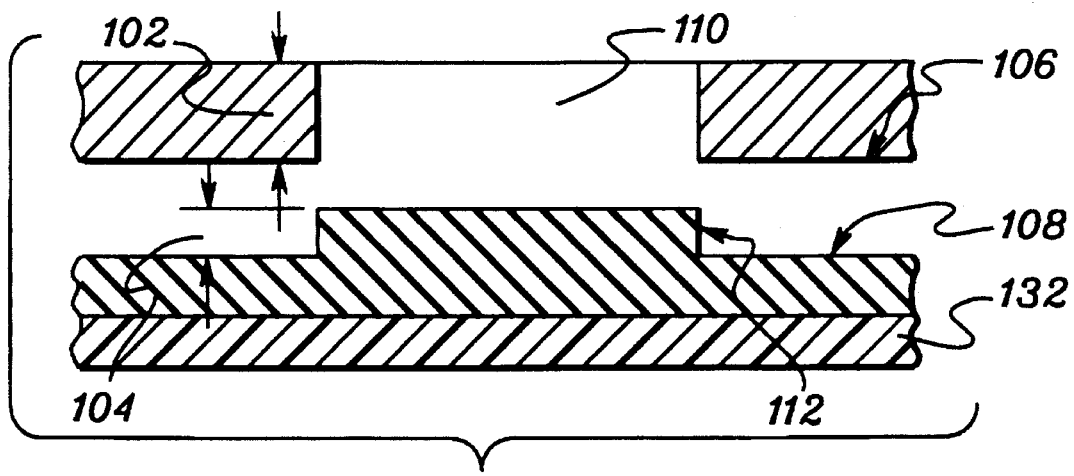
FIGS. 8a–8d illustrate the effects of two different etch depths on the stacking of two integrated circuit chips pursuant to the principles of the present invention.
Figure 8B:
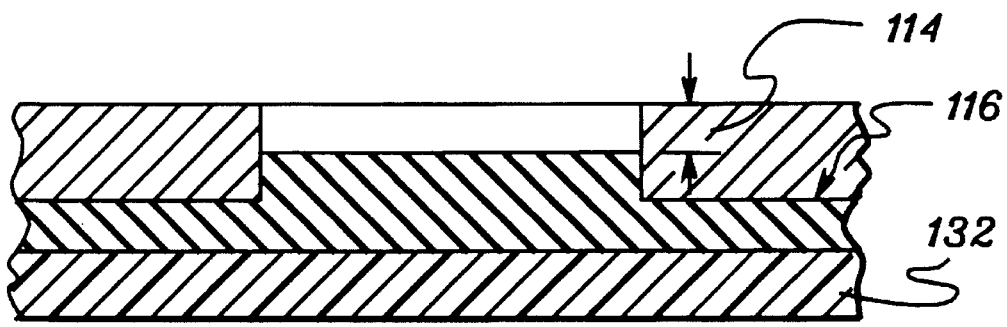

FIGS. 8a–8d illustrate an embodiment of the present invention which combines a projection/recess architecture with the thickness control layer. In FIG. 8a, a back surface 106 of a first chip, which back surface could comprise a layer or the silicon substrate, contains a recess 110 of depth 102. In the preferred embodiment, the front surface 108 of a second adjacent chip comprises a thickness control layer over the substrate 132 because of the need to protect any underlying devices. The layer is deposited, planarized and then etched to form the projection 112. The depth 104 of material etched is determined by the measured thickness of the ground wafer, and can be varied depending on the measured thickness of the integrated circuit chip to be stacked, as discussed above. FIG. 8b depicts the two surfaces upon lamination at junction 116. In this example, the etched distance results in a void 114 left between the two chips in the groove. In one embodiment, such voids could be used to hold the adhesive applied to fasten the chips together.

Figure 8C:
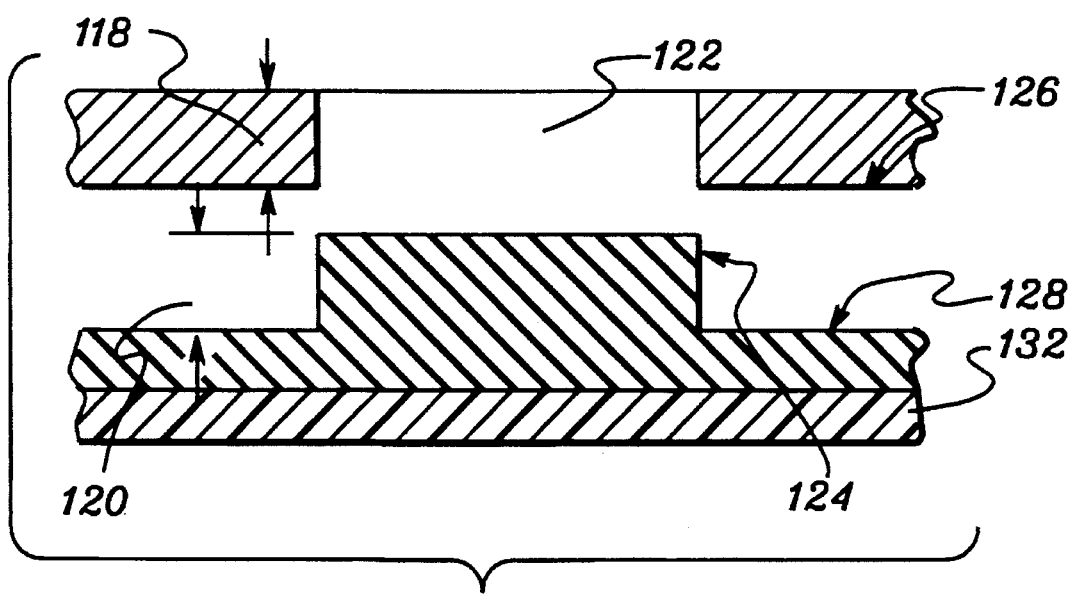
Figure 8D:
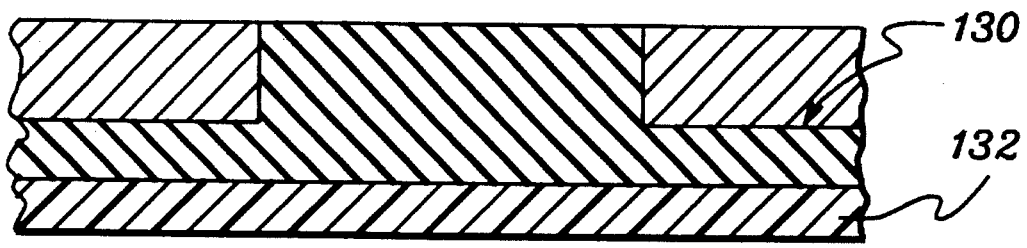

FIGS. 8c–8d depict another example of a back surface 126 and front surface 128 of respective adjacent chips. The back surface or layer 126 is formed having a recess 122 of depth 118. In this example, when forming the projection 124, the etched distance 120 of the front layer 128 is somewhat larger than that in the previous example. Again, the etched distance is adjusted based on the measured thickness of the wafer after grinding and is fully adjustable. FIG. 8d depicts the result when the two surfaces are joined and laminated at junction 130. The resultant thickness control tolerance is limited now by the deposition and etch and can be approximately ±2½ μm, which is a substantial improvement over the tolerance of the fixed reference grinding technique.

Figure 9:
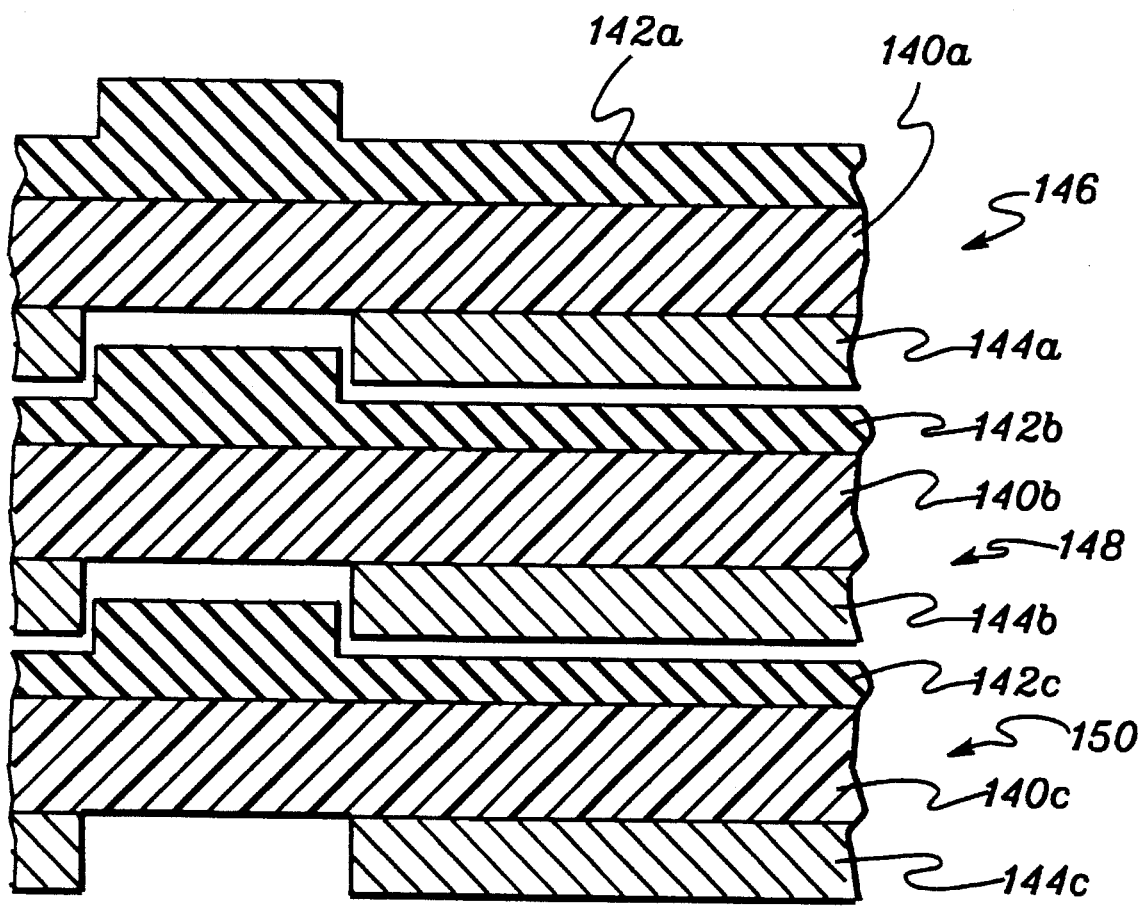
FIG. 9 illustrates three integrated circuit chips, each having layers for thickness control and complementary patterns for lateral alignment pursuant to the principles of the present invention.

FIG. 9 depicts three integrated circuit chips 146, 148 and 150 which are assembled into a stack structure in accordance with one embodiment of the present invention. In this embodiment, front layers 142a–c are deposited on the front surface of each respective integrated circuit chip and back layers 144a–c are deposited on the back surface of each respective integrated circuit chip. The complementary patterns are then etched into the layers. As discussed above, the depths of the front layer etch may be controlled based on the measured thicknesses of each of the substrates 140a–c. The combination of the thickness control layer and the projection/recess structure provides the dimensional tolerances required for a side face bus and I/O network as discussed above. In addition, the recesses are formed on a layer, rather than in the wafer. Thus, a thinner wafer can be tolerated for reduced stray capacitance.

Figure 10A:
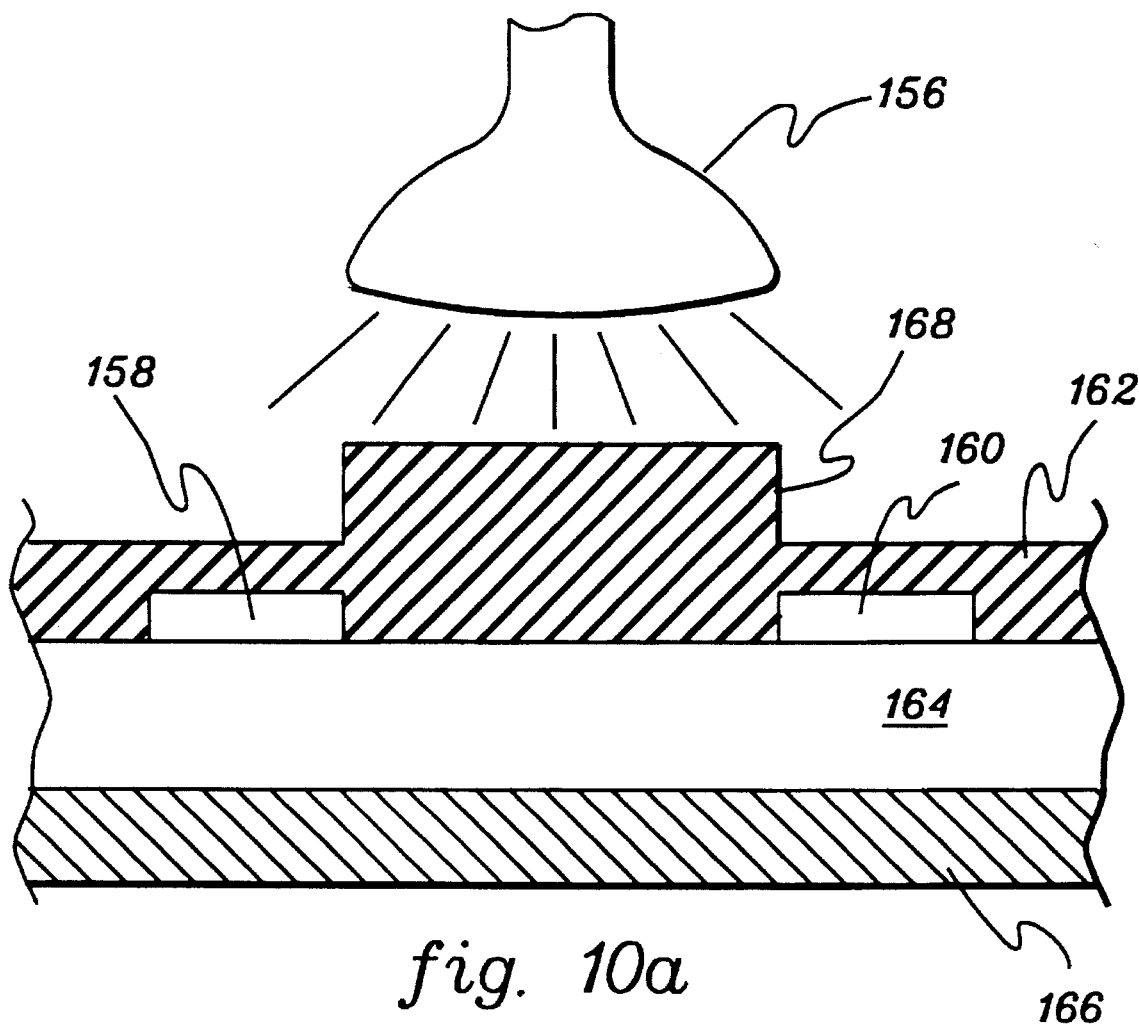
FIGS. 10a–10b illustrate a technique for aligning the complementary patterns on the front and back surfaces of multiple integrated circuit chips pursuant to the principles of the present invention.
Figure 10B:
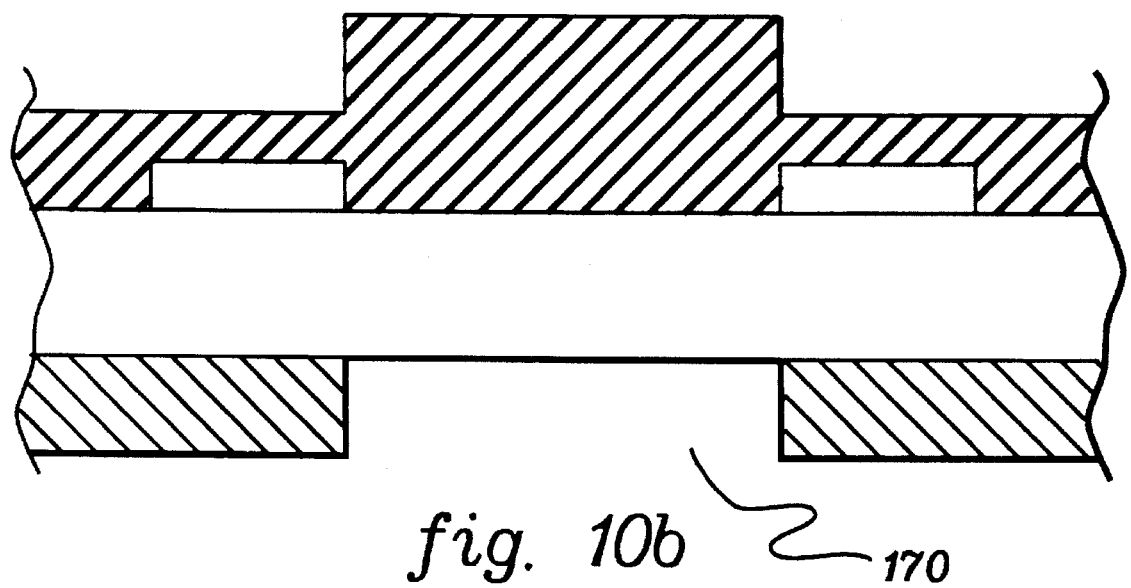

FIGS. 10a–10b illustrate one embodiment of a technique employed to align multiple chips having layers deposited (and etched) on the back and front surfaces of each chip. The chip fabrication process generally results in devices 158 and 160 formed on the substrate 164. These devices are aligned from chip to chip because of the masks employed, and this alignment is generally independent of the chip edges. A chip-to-chip alignment between these devices when the chips are stacked is therefore desirable.

Such alignment can be accomplished by depositing and etching layer 162 according to the location of the devices using photoresist masks (not shown) similar to those used during device formation. In FIG. 10a, the projection 168 of layer 162 can therefore be aligned to the devices 158 and 160 to within 0.5 μm using present technology. This process is then repeated for each chip that is formed. The resulting chips have front layers with projections aligned to the devices, and since the devices are aligned from chip to chip, the projections are also tightly aligned.

Following the formation of the projections on each chip, a light source 156 is employed to align a mask at the back of each chip. The light source, in one embodiment, has an infrared wavelength. Upon irradiating the front of chip 164, the light is "modulated" by the projection pattern or devices near the front of the substrate and penetrates the chip. The modulated light can then be sensed at the back surface and used as an alignment tool to align a mask (not shown) for the subsequent etch of layer 166. The recess 170 is then etched according to the aligned mask. This alignment and etch process is then repeated for each chip.

More particularly, the method includes: etching a pattern into a first (e.g., top) surface according to a first mask aligned to the devices, the pattern having regions of different heights relative to the first surface; irradiating the first surface with penetrating electromagnetic energy; aligning a second mask adjacent a second (e.g., bottom) surface to the pattern by detecting portions of the penetrating electromagnetic energy emanating from the second surface; and etching a complementary pattern into the second surface according to the second mask, the complementary pattern having regions of different heights relative to the second surface.

The resulting complementary patterns formed on the front and back of each chip (which are subsequently stacked in the three-dimensional structure) are therefore created from a common reference point (i.e., the devices) and provide the alignment required for the dense bus and I/O network discussed above. Those skilled in the art will recognize that many variations of this technique are possible including, for example, back-to-front irradiation, alternative pattern configurations, and forming the patterns in the substrate or other layers created during the fabrication process.

While the invention has been described in detail herein in accordance with certain preferred embodiments thereof, many modifications and changes therein may be affected by those skilled in the art. Accordingly, it is intended by the following claims to cover all such modifications and changes as fall within the true spirit and scope of the invention.

What is claimed is:

1. A method for aligning a pattern formed on a first surface of an integrated circuit chip with a complementary pattern formed on a second surface of said integrated circuit chip, said first surface having devices therebelow, said method comprising the steps of:

etching the pattern into said first surface according to a first mask aligned to said devices, said pattern having regions of different heights relative to said first surface;

irradiating said first surface with penetrating electromagnetic energy, the penetrating electromagnetic energy being affected by said pattern or said devices Upon passage through said chip;

aligning a second mask adjacent said second surface to said pattern including sensing said affected penetrating electromagnetic energy emanating from said second surface and aligning said second mask according to the sensed affected penetrating electromagnetic energy; and etching a complementary pattern into said second surface according to said second mask, said complementary pattern having regions of different heights relative to said second surface.

2. The method of claim 1, further comprising the step of repeating all said steps for each of a plurality of integrated circuit chips such that upon stacking said plurality of integrated circuit chips the patterns and complementary patterns of adjacent ones of said plurality of integrated circuit chips will interlock.

3. The method of claim 2, further comprising the step of providing electrically conducting pads on corresponding edges of selected ones of said plurality of integrated circuit chips such that upon stacking said plurality of integrated circuit chips said electrically conducting pads are aligned on a module face formed from said corresponding edges.

4. The method of claim 3, further comprising forming an electrical wiring network on said module face, said electrical wiring network electrically contacting selected ones of said electrically conducting pads.

5. The method of claim 1, further comprising the steps of:

repeating all said steps for each of a plurality of integrated circuit chips; and stacking said plurality of integrated circuit chips such that the patterns and complementary patterns of adjacent ones of said plurality of integrated circuit chips interlock.

6. The method of claim 5, further comprising the step of providing electrically conducting pads on corresponding edges of at least two of said plurality of integrated circuit chips such that upon stacking said plurality of integrated circuit chips said electrically conducting pads are aligned on a module face formed from said corresponding edges.

7. The method of claim 6, further comprising the step of forming an electrical wiring network on said module face, said electrical wiring network electrically contacting at least two of said electrically conducting pads.

8. The method of claim 1, wherein said pattern is etched into a first layer disposed on said first surface.

9. The method of claim 8, wherein said first layer comprises a thickness control layer.

10. The method of claim 1, wherein said complementary pattern is etched into a second layer disposed on said second surface.

11. The method of claim 10, wherein said second layer comprises a thickness control layer.

* * * * *